US012451347B2

(12) United States Patent
Lim et al.

(10) Patent No.: US 12,451,347 B2
(45) Date of Patent: Oct. 21, 2025

(54) SEMICONDUCTOR PROCESSING METHOD

(71) Applicant: ASM IP Holding B.V., Almere (NL)

(72) Inventors: Wangyu Lim, Hwaseong-si (KR); Heesung Kang, Anyang-si (KR); Jaeok Ko, Seoul (KR); Jaebin Ahn, Suwon-si (KR); Sunja Kim, Hwaseong-si (KR); Youngjae Kim, Cheonan-si (KR); Donghyun Ko, Hwaseong-si (KR)

(73) Assignee: ASM IP Holding B.V., Almere (NL)

( * ) Notice: Subject to any disclaimer, the term of this patent is extended or adjusted under 35 U.S.C. 154(b) by 864 days.

(21) Appl. No.: 17/701,433

(22) Filed: Mar. 22, 2022

(65) Prior Publication Data

US 2022/0310387 A1 Sep. 29, 2022

Related U.S. Application Data

(60) Provisional application No. 63/166,152, filed on Mar. 25, 2021.

(51) Int. Cl.
*H01L 21/02* (2006.01)
*H01L 21/764* (2006.01)

(52) U.S. Cl.
CPC ...... *H01L 21/02312* (2013.01); *H01L 21/764* (2013.01)

(58) Field of Classification Search
CPC ............ H01L 21/02312; H01L 21/764; H01L 21/0217; H01L 21/02211; H01L 21/02274; H01L 21/0228; H01L 21/02315; H01L 21/32; H01L 21/7682; H01L 21/02304; H01L 2221/1042; C23C 16/0272; C23C 16/04; C23C 16/45527
See application file for complete search history.

(56) References Cited

U.S. PATENT DOCUMENTS

| | | | |
|---|---|---|---|
| 6,897,119 B1* | 5/2005 | Sneh | C23C 16/02 438/584 |
| 10,431,452 B2 | 10/2019 | Takahashi et al. | |
| 2003/0025209 A1* | 2/2003 | Jiwari | H01L 21/0234 257/E21.264 |
| 2004/0188774 A1* | 9/2004 | Takeda | H10D 84/013 257/E21.619 |
| 2007/0218623 A1* | 9/2007 | Chua | H01L 21/02156 257/E21.279 |
| 2015/0221541 A1 | 8/2015 | Nemani | |
| 2017/0186683 A1* | 6/2017 | Lin | H01L 23/53228 |
| 2019/0280112 A1* | 9/2019 | Shimizu | H01L 21/2233 |
| 2020/0279733 A1* | 9/2020 | Kumakura | H01L 21/0335 |

(Continued)

FOREIGN PATENT DOCUMENTS

WO WO-2012167282 A1 * 12/2012 ......... H01L 29/0676

*Primary Examiner* — William B Partridge
*Assistant Examiner* — Erik A. Anderson
(74) *Attorney, Agent, or Firm* — Snell & Wilmer L.L.P.

(57) ABSTRACT

A substrate processing method of forming an air gap includes: forming deposition inhibitor sites in a lower space between a first protrusion and a second protrusion; and forming film-forming sites and an interlayer insulating layer on the first protrusion and the second protrusion, wherein the interlayer insulating layer is selectively formed in an upper space between the first protrusion and the second protrusion by the deposition inhibitor sites and the film-forming layer, and thus an air gap is formed between the first protrusion and the second protrusion.

17 Claims, 7 Drawing Sheets

(56) References Cited

U.S. PATENT DOCUMENTS

2021/0272803 A1\* 9/2021 Nakatani ................. H01L 21/32
2022/0093388 A1\* 3/2022 Nakatani ........... H01L 21/02274
2022/0208555 A1\* 6/2022 Lee ..................... H01L 21/0337

\* cited by examiner

SEMICONDUCTOR PROCESSING METHOD

CROSS-REFERENCE TO RELATED APPLICATIONS

This application claims the benefit of U.S. Provisional Application No. 63/166,152, filed on Mar. 25, 2021, in the United States Patent and Trademark Office, the disclosure of which is incorporated herein in its entirety by reference.

BACKGROUND

1. Field

One or more embodiments relate to a substrate processing method, and more particularly, to a substrate processing method of forming an air gap inside a gap between pattern structures.

2. Description of the Related Art

As an area of a dielectric (e.g. capacitor) is increased and a thickness of the dielectric is reduced by reducing a circuit width and increasing integration of a semiconductor memory device, problems such as leakage current occur in the dielectric due to electron tunneling. In order to solve the problems, a high-k material is used for the dielectric, but problems such as leakage current or diffusion of metal elements occur due to interaction between a bit line of a memory device and a metal.

In order to solve the problems, a low-k material, which is an insulating material, is applied, and devices are being developed in a direction of using an air gap spacer using air, a material with the lowest dielectric constant. For example, Korean Patent Publication No. 10-2010-0122701 discloses a process of forming such an air gap. In more detail, the document discloses a technical idea of forming an insulating film between metal wires and performing a deposition process to form an overhang so that an air gap is formed by the overhang.

SUMMARY

One or more embodiments include a substrate processing method capable of preventing interference between pattern structures by forming an air gap of sufficient size.

Additional aspects will be set forth in part in the description which follows and, in part, will be apparent from the description, or may be learned by practice of the presented embodiments of the disclosure.

According to one or more embodiments, a substrate processing method includes: forming first terminated sites on a pattern structure including a first protrusion and a second protrusion; forming second terminated sites different from the first terminated sites on the pattern structure on which the first terminated sites are formed; and forming a first layer on the first terminated sites and the second terminated sites.

According to an example of the substrate processing method, the substrate processing method may further include forming a protective layer on the pattern structure, wherein the first terminated sites and the second terminated sites may be formed on a surface of the protective layer.

According to another example of the substrate processing method, the first terminated sites may be at a first portion of the protective layer in a lower portion of the pattern structure, and the second terminated sites may be at a second portion of the protective layer in an upper portion of the pattern structure.

According to another example of the substrate processing method, the forming of the first layer may be inhibited on the first portion by the first terminated sites, and may be promoted on the second portion by the second terminated sites.

According to another example of the substrate processing method, the first terminated sites may be fluorine-terminated sites.

According to another example of the substrate processing method, the second terminated sites may be hydrogen-terminated sites.

According to another example of the substrate processing method, the forming of the first layer may include: supplying a source gas having reactivity with the second terminated sites; and supplying a reactive gas.

According to another example of the substrate processing method, the source gas may include a silicon precursor, and Si—H-terminated sites may be formed by the supplying of the source gas.

According to another example of the substrate processing method, the forming of the Si—H-terminated sites may be inhibited at the first terminated sites and promoted at the second terminated sites.

According to another example of the substrate processing method, the forming of the first terminated sites may be performed under a plasma condition of a first frequency, and the forming of the second terminated sites may be performed under a plasma condition of a second frequency greater than the first frequency.

According to another example of the substrate processing method, the forming of the first terminated sites may be performed under a first process pressure, and the forming of the second terminated sites may be performed under a second process pressure greater than the first process pressure.

According to another example of the substrate processing method, the substrate processing method may further include forming a second layer on the first layer. In an alternative embodiment, the substrate processing method may further include forming at least one terminated site on the first layer between the forming of the first layer and the forming of the second layer.

According to another example of the substrate processing method, during the forming of the first terminated sites, a first cycle including supplying a fluorine-containing gas may be performed at least once.

According to another example of the substrate processing method, the fluorine-containing gas may include $NF_3$.

According to another example of the substrate processing method, during the forming of the second terminated sites, a second cycle including supplying a hydrogen-containing gas may be performed at least once.

According to another example of the substrate processing method, the hydrogen-containing gas may include $H_2$.

According to another example of the substrate processing method, at least a portion of an interlayer insulating layer covering the pattern structure may be formed, an air gap may be formed between the first protrusion and the second protrusion, and the interlayer insulating layer may include the first layer.

According to another example of the substrate processing method, the air gap may include a gas containing a fluorine element.

According to one or more embodiments, a substrate processing method includes: forming a protective layer on a pattern structure including a first protrusion and a second protrusion; supplying a fluorine-containing gas under a first plasma condition of a first frequency and first process pressure to form fluorine-terminated sites on the protective layer; purging the fluorine-containing gas; supplying a hydrogen-containing gas under a second plasma condition of a second frequency higher than the first frequency and second process pressure higher than the first process pressure to form hydrogen-terminated sites on the protective layer; purging the hydrogen-containing gas; supplying a silicon-containing source gas to form Si—H-terminated sites, wherein the forming of the Si—H-terminated sites is promoted on the hydrogen-terminated sites and inhibited on the fluorine-terminated sites; purging the silicon-containing source gas; forming an interlayer insulating layer on the protective layer by supplying a reactive gas having reactivity with the Si—H-terminated sites; and purging the reactive gas.

According to one or more embodiments, a substrate processing method includes: forming deposition inhibitor sites in a lower space between a first protrusion and a second protrusion; and forming an interlayer insulating layer on the first protrusion and the second protrusion, wherein the interlayer insulating layer is selectively formed in an upper space between the first protrusion and the second protrusion by the deposition inhibitor sites, and thus an air gap is formed between the first protrusion and the second protrusion.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
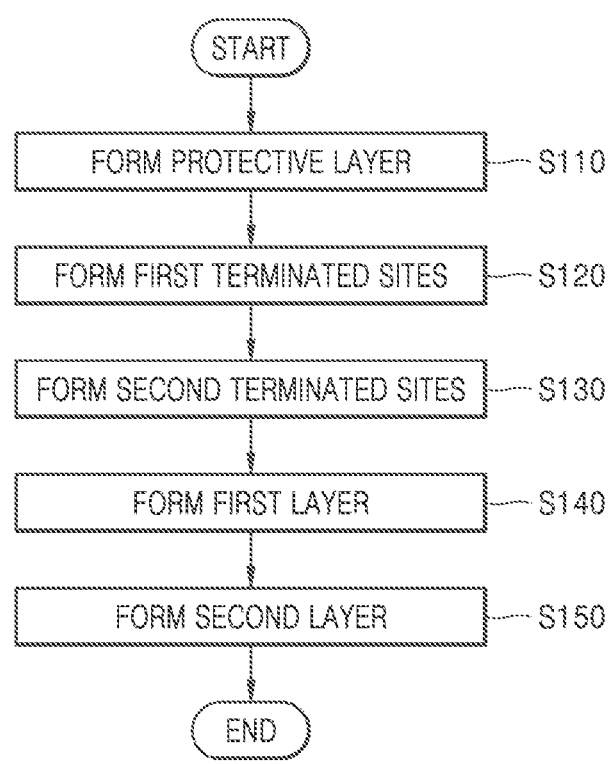
FIG. 1 is a flowchart of a substrate processing method according to embodiments.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Expressions such as "at least one of," when preceding a list of elements, modify the entire list of elements and do not modify the individual elements of the list.

Hereinafter, one or more embodiments will be described more fully with reference to the accompanying drawings.

In this regard, the present embodiments may have different forms and should not be construed as being limited to the descriptions set forth herein. Rather, these embodiments are provided so that the present disclosure will be thorough and complete, and will fully convey the scope of the present disclosure to one of ordinary skill in the art.

The terminology used herein is for describing particular embodiments and is not intended to limit the disclosure. As used herein, the singular forms "a", "an", and "the" are intended to include the plural forms as well, unless the context clearly indicates otherwise. It will be further understood that the terms "includes", "comprises" and/or "including", "comprising" used herein specify the presence of stated features, integers, steps, processes, members, components, and/or groups thereof, but do not preclude the presence or addition of one or more other features, integers, steps, processes, members, components, and/or groups thereof. As used herein, the term "and/or" includes any and all combinations of one or more of the associated listed items.

It will be understood that, although the terms first, second, etc. may be used herein to describe various members, components, regions, layers, and/or sections, these members, components, regions, layers, and/or sections should not be limited by these terms. These terms do not denote any order, quantity, or importance, but rather are only used to distinguish one component, region, layer, and/or section from another component, region, layer, and/or section. Thus, a first member, component, region, layer, or section discussed below could be termed a second member, component, region, layer, or section without departing from the teachings of embodiments.

In the disclosure, "gas" may include evaporated solids and/or liquids and may include a single gas or a mixture of gases. In the disclosure, a process gas introduced into a reaction chamber through a shower head may include a precursor gas and an additive gas. The precursor gas and the additive gas may typically be introduced as a mixed gas or may be separately introduced into a reaction space. The precursor gas may be introduced together with a carrier gas such as an inert gas. The additive gas may include a dilution gas such as a reactive gas and an inert gas. The reactive gas and the dilution gas may be mixedly or separately introduced into the reaction space. The precursor may include two or more precursors, and the reactive gas may include two or more reactive gases. The precursor may be a gas that is chemisorbed onto a substrate and typically contains metalloid or metal elements constituting a main structure of a matrix of a dielectric film, and the reactive gas for deposition may be a gas that is reactive with the precursor chemisorbed onto the substrate when excited to fix an atomic layer or a monolayer on the substrate. The term "chemisorption" may refer to chemical saturation adsorption. A gas other than the process gas, that is, a gas introduced without passing through the shower head, may be used to seal the reaction space, and it may include a seal gas such as an inert gas. In some embodiments, the term "film" may refer to a layer that extends continuously in a direction perpendicular to a thickness direction without substantially having pinholes to cover an entire target or a relevant surface, or may refer to a layer that simply covers a target or a relevant surface. In some embodiments, the term "layer"

may refer to a structure, or a synonym of a film, or a non-film structure having any thickness formed on a surface. The film or layer may include a discrete single film or layer or multiple films or layers having some characteristics, and the boundary between adjacent films or layers may be clear or unclear and may be set based on physical, chemical, and/or some other characteristics, formation processes or sequences, and/or functions or purposes of the adjacent films or layers.

In the disclosure, the expression "containing an Si—N bond" may be referred to as characterized by an Si—N bond or Si—N bonds having a main skeleton substantially constituted by the Si—N bond or Si—N bonds and/or having a substituent substantially constituted by the Si—N bond or Si—N bonds. A silicon nitride layer may be a dielectric layer containing a Si—N bond, and may include a silicon nitride layer (SiN) and a silicon oxynitride layer (SiON).

In the disclosure, the expression "same material" should be interpreted as meaning that main components (constituents) are the same. For example, when a first layer and a second layer are both silicon nitride layers and are formed of the same material, the first layer may be selected from the group consisting of Si2N, SiN, Si3N4, and Si2N3 and the second layer may also be selected from the above group but a particular film quality thereof may be different from that of the first layer.

Additionally, in the disclosure, according as an operable range may be determined based on a regular job, any two variables may constitute an operable range of the variable and any indicated range may include or exclude terminated sites. Additionally, the values of any indicated variables may refer to exact values or approximate values (regardless of whether they are indicated as "about"), may include equivalents, and may refer to an average value, a median value, a representative value, a majority value, or the like.

In the disclosure where conditions and/or structures are not specified, those of ordinary skill in the art may easily provide these conditions and/or structures as a matter of customary experiment in the light of the disclosure. In all described embodiments, any component used in an embodiment may be replaced with any equivalent component thereof, including those explicitly, necessarily, or essentially described herein, for intended purposes, and in addition, the disclosure may be similarly applied to devices and methods.

Hereinafter, embodiments of the disclosure will be described with reference to the accompanying drawings. In the drawings, variations from the illustrated shapes may be expected because of, for example, manufacturing techniques and/or tolerances. Thus, the embodiments of the disclosure should not be construed as being limited to the particular shapes of regions illustrated herein but may include deviations in shapes that result, for example, from manufacturing processes.

FIG. 1 is a flowchart of a substrate processing method according to embodiments.

Referring to FIG. 1, a substrate having a pattern structure is prepared. For example, a substrate may be loaded into a reaction space of a substrate processing apparatus. The substrate may be a semiconductor substrate, and may include, for example, any one of silicon, a silicon-on-insulator, silicon-on-sapphire, germanium, silicon-germanium, and gallium-arsenide.

The pattern structure is a non-flat structure, and may be a stepped structure including an upper surface 412, a lower surface 414, and a side surface 416 connecting the upper surface and the lower surface. For example, the pattern structure may include a plurality of protrusions defined by a plurality of recesses. The pattern structure may be used to form an active region or may be used to form a gate pattern. For example, the pattern structure may include a first protrusion and a second protrusion, and each of the first protrusion and the second protrusion may include a gate electrode. When the pattern structure is used to implement a flash memory, each of the first protrusion and the second protrusion may further include a tunneling insulating layer.

In operation S110, when the substrate is prepared, a protective layer 210 may be formed on the pattern structure. During operation S110 of forming the protective layer, a thin film deposition process using plasma may be used. For example, at least one of plasma atomic layer deposition (PEALD), plasma chemical vapor deposition (PECVD), pulsed plasma chemical vapor deposition (Pulsed PECVD), and cyclic pulsed PECVD may be used.

Figure 5:
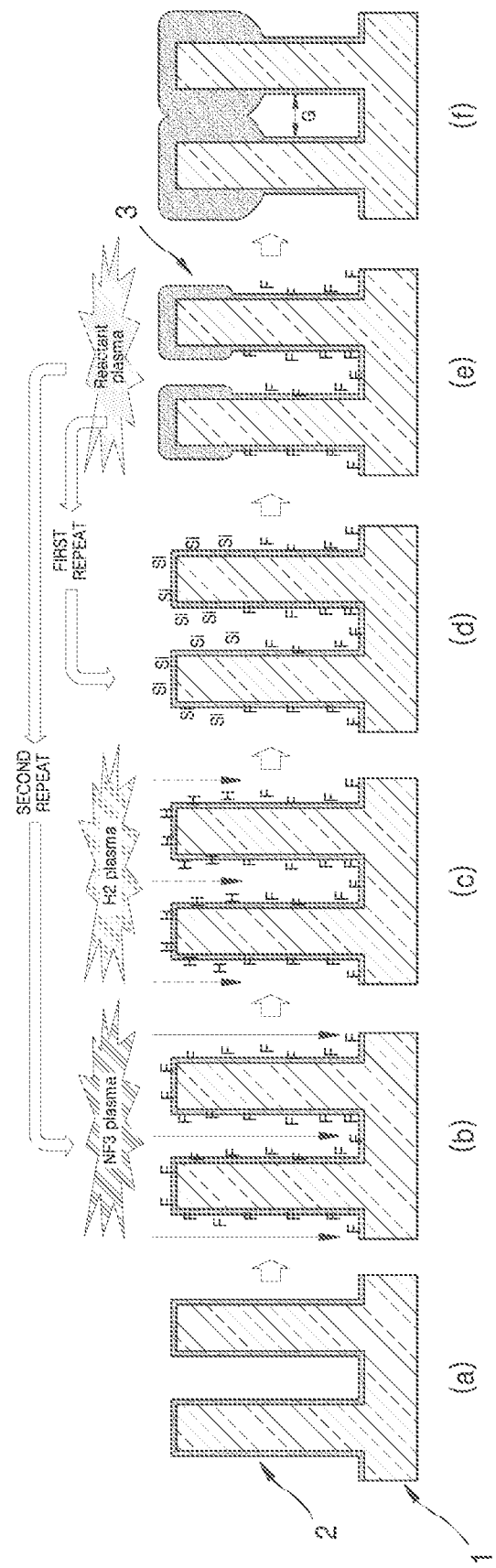
FIG. 5 is a view illustrating a substrate processing method according to embodiments.

The protective layer may be configured to protect the pattern structure from radicals formed during a plasma process to be described later below. For example, the protective layer may be configured to protect the pattern structure from radicals and fluorine ions supplied during forming of first terminated sites. An exemplary state in which a protective layer is formed on a pattern structure is shown in FIG. 5(*a*).

In some embodiments, the protective layer may include a component of a gas supplied during operation S120 of forming the first terminated sites. For example, when nitrogen trifluoride ($NF_3$) is used to form the first terminated sites, the protective layer may include a nitrogen element. For example, the protective layer may include silicon nitride.

After the protective layer 210 is formed on the pattern structure, a process for forming deposition inhibitor sites and film-forming sites on the protective layer is performed. First, in operation S120, in order to form the deposition inhibitor sites, first terminated sites, illustrated as F, may be formed on a surface of the protective layer. Thereafter, in operation S130, second terminated sites, illustrated as H, may be formed on the surface of the protective layer to form film-forming sites.

In an alternative embodiment, operation S110 of forming the protective layer may be omitted. Regardless of the presence or absence of the protective layer, the first terminated sites and the second terminated sites will be formed on the pattern structure including a first protrusion and a second protrusion.

During operation S120 of forming the first terminated sites, a first gas may be supplied to form terminated sites capable of inhibiting subsequent deposition on the protective layer. For example, the first terminated sites may be fluorine-terminated sites, in which case a fluorine-containing gas (e.g., nitrogen trifluoride) may be supplied during the forming of the first terminated sites.

In some embodiments, operation S120 of forming the first terminated sites may be performed under a first plasma condition such that the first terminated sites may be uniformly formed on the protective layer. For example, a frequency of plasma and a process pressure may be set relatively low so that the first terminated sites may be evenly formed on all surfaces of the protective layer (top, bottom, and sides connecting top and bottom).

In an embodiment, the first plasma condition may include a first frequency (e.g., 430 kHz) and first process pressure (1 Torr to 5 Torr). That is, the first plasma condition may be set so that a mean free path of the first gas supplied to the reaction space increases, and thus the first gas may reach a bottom surface of the protective layer. An exemplary state in which the first terminated sites are formed on the protective layer is shown in FIG. 5(b).

After the first terminated sites are formed, operation S130 of forming the second terminated sites different from the first terminated sites to form film-forming sites on the protective layer is performed. During operation S130 of forming the second terminated sites, a second gas may be supplied to form terminated sites capable of promoting subsequent deposition on the protective layer. For example, the second terminated sites may be hydrogen-terminated sites, and in this case, a hydrogen-containing gas (e.g., hydrogen ($H_2$)) may be supplied during operation S130 of forming the second terminated sites.

In some embodiments, operation S130 of forming the second terminated sites may be performed under a second plasma condition such that the second terminated sites may be selectively formed on the protective layer. For example, a frequency of plasma and a process pressure may be set relatively high so that the second terminated sites may be selectively formed on the protective layer.

In an embodiment, the second plasma condition may include a second frequency (e.g., 13.56 MHz) and second process pressure (5 Torr to 30 Torr). That is, the second plasma condition may be set such that a mean free path of the second gas supplied to the reaction space decreases, and thus the second gas may stay around an upper surface of the protective layer without reaching the bottom surface of the protective layer. Therefore, ions and radicals of the second gas generated by application of second plasma may react with a portion of the protective layer on the upper surface of the protective layer, and thus the first terminated sites around the upper surface of the protective layer may be replaced with the second terminated sites.

An exemplary state in which the first terminated sites and second terminated sites are formed on the protective layer is illustrated in FIG. 5(c). By operation S120 of forming the first terminated sites and operation S130 of forming the second terminated sites that are described above, the first terminated sites may be formed in a first portion of the protective layer, and the second terminated sites may be formed in a second portion of the protective layer. For example, the first portion in which the first terminated sites are formed may be located in a lower portion of the pattern structure, and the second portion in which the second terminated sites are formed may be located in an upper portion of the pattern structure (see FIG. 2).

Thereafter, operation S140 of forming a first layer on the first terminated sites and the second terminated sites is performed. The first terminated sites and the second terminated sites may influence the forming of the first layer. The first terminated sites may act as deposition inhibitor sites, and the forming of the first layer may be inhibited on the first portion (i.e., a portion where the first terminated sites are formed) of the protective layer by the first terminated sites. On the other hand, the forming of the first layer may be promoted on the second portion (i.e., a portion where the second terminated sites are formed) of the protective layer by the second terminated sites.

In some embodiments, operation S140 of forming the first layer may include supplying a source gas and supplying a reactive gas. In an alternative embodiment, the supplying of the source gas and the supplying of the reactive gas may be included in a deposition cycle which is repeated a plurality of times. In addition, a purge operation may be performed after the supplying of the source gas or after the supplying of the reactive gas.

The source gas may include a material having reactivity with the second terminated sites. Thus, during the supplying of the source gas, the second terminated sites may be replaced with third terminated sites containing an element of the source gas. For example, the source gas may include a silicon precursor, and in this case, Si-terminated sites (or Si—H-terminated sites) may be formed by supplying the source gas. In other words, the second terminated sites, which are H-terminated sites, may be replaced with the third terminated sites, which are the Si-terminated sites (or the Si—H-terminated sites).

In an alternative embodiment, plasma may be applied during the supplying of the source gas. The application of plasma may facilitate replacement of the second terminated sites with the third terminated sites. In an alternative embodiment, supplying of a reactive purge gas may be stopped during the supplying of the source gas. In another embodiment, during the supplying of the source gas, the reactive purge gas may be supplied, and plasma conditions may be adjusted so that the reactive purge gas is not excited while the source gas is excited.

The source gas may include a material that does not react with the first terminated sites (or a material with low reactivity). Thus, during the supplying of the source gas, the forming of the third terminated sites may be inhibited at the first terminated sites. For example, when a silicon precursor is supplied as a source gas to form Si—H-terminated sites on the protective layer, the forming of the Si—H-terminated sites may be inhibited at the first terminated sites and promoted at the second terminated sites. An exemplary state in which the Si—H-terminated sites are formed on the protective layer is shown in FIG. 5(d).

Thereafter, a reactive gas is supplied. The reactive gas may include a material having reactivity with the source gas. In some embodiments, the reactive gas may include a material having reactivity with the source gas under certain conditions (e.g., plasma application conditions). A first layer may be formed on the protective layer by supplying the reactive gas and chemically reacting with source element-containing layers, e.g. Si—H-terminated sites.

As described above, by forming the first terminated sites serving as deposition inhibitor sites in a lower space between the first protrusion and the second protrusion, a first layer 3 serving as an interlayer insulating layer may be selectively formed. That is, due to the deposition inhibitor sites, the first layer may be selectively formed in an upper space between the first protrusion and the second protrusion. An exemplary view of selective forming of the first layer is shown in FIG. 5 (e).

Thereafter, operation S150 of forming a second layer on the first layer is performed. Operation S150 of forming the second layer may include an operation performed to form the first layer (e.g., the supplying of the source gas and the reactive gas). An exemplary state in which the second layer is formed on the first layer is shown in FIG. 5(f).

By forming the first layer and the second layer on the pattern structure as described above, an interlayer insulating layer covering the pattern structure may be formed. In addition, an air gap may be formed between the interlayer insulating layer and the pattern structure. Accordingly, an air gap may be formed between the first protrusion and the second protrusion to prevent the occurrence of leakage current.

In some embodiments, the first terminated sites may be used as deposition inhibitor sites, so that deposition on a portion in which the first terminated sites are formed may be inhibited while forming the interlayer insulating layer. Furthermore, even after the interlayer insulating layer is formed, components of the first terminated sites may remain in the air gap. For example, when the first terminated sites are fluorine-terminated sites, the air gap may include a gas having a fluorine element.

In more detail, nitrogen trifluoride may be used to form the first terminated sites. In this case, a gas having nitrogen and/or fluorine elements (e.g., nitrogen trifluoride and hydrogen fluoride) as the components of the first terminated sites may be included in the air gap. In addition, when the interlayer insulating layer includes a material containing silicon (e.g., silicon oxide and silicon nitride), a gas including components of the interlayer insulating layer and the components of the first terminated sites may be included in the air gap (e.g., silicon tetrafluoride).

Although FIG. 1 shows and describes operation S140 of forming the first layer and operation S150 of forming the second layer as separate operations for forming the interlayer insulating layer, operation S140 of forming the first layer and operation S150 of forming the second layer may be the same operations included in the deposition cycle. In another embodiment, the forming of the second layer may be omitted, and in this case, only the operation/cycle of forming the first layer may be performed to form the interlayer insulating layer.

In an alternative embodiment, between operation S140 of forming the first layer and operation S150 of forming the second layer, an additional operation of forming the first terminated sites and/or second terminated sites may be performed. This additional forming of the first/second terminated sites may contribute to supplementing terminated sites that disappear upon repetition of the deposition cycle (especially terminated sites for inhibiting deposition formed below a gap between protrusions).

Figure 2:
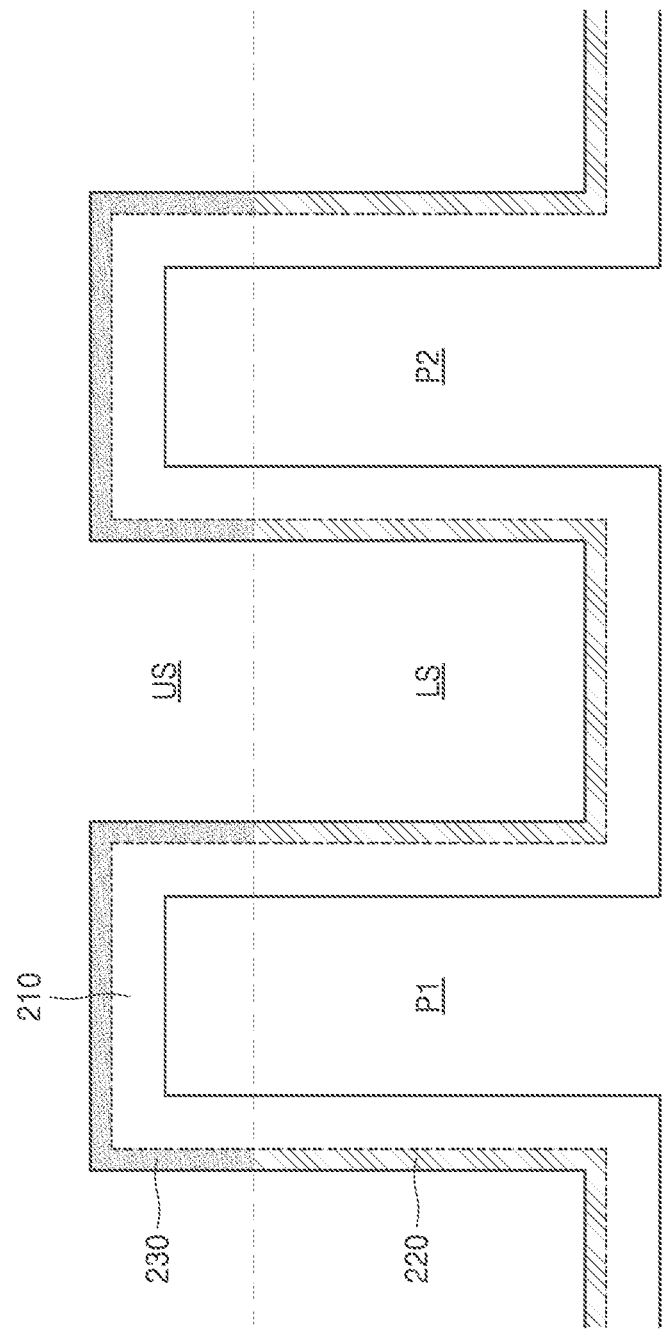
FIG. 2 is a view of a semiconductor device manufactured by using a substrate processing method according to embodiments.

FIG. 2 shows a semiconductor device manufactured using the substrate processing method of FIG. 1.

As described above and as shown in FIG. 2, by forming a deposition inhibitor site 220 in a lower space LS between a first protrusion P1 and a second protrusion P2 before forming a first layer, during forming of an interlayer insulating layer, deposition of a thin film in the lower space LS is prevented, so that an air gap may be easily formed. As a result, the interlayer insulating layer is selectively formed in an upper space US between the first protrusion P1 and the second protrusion P2 by the deposition inhibitor site 220, an air gap having a sufficient size may be formed in the lower space LS between the first protrusion P1 and the second protrusion P2.

In addition, by forming a film-forming site 230 in the upper space US between the first protrusion P1 and the second protrusion P2 before forming the first layer, during the forming of the interlayer insulating layer, deposition of a thin film covering the upper space US may be promoted. Accordingly, the interlayer insulating layer may be formed at a high speed, thereby ensuring an air gap having a sufficient size.

Figure 3:
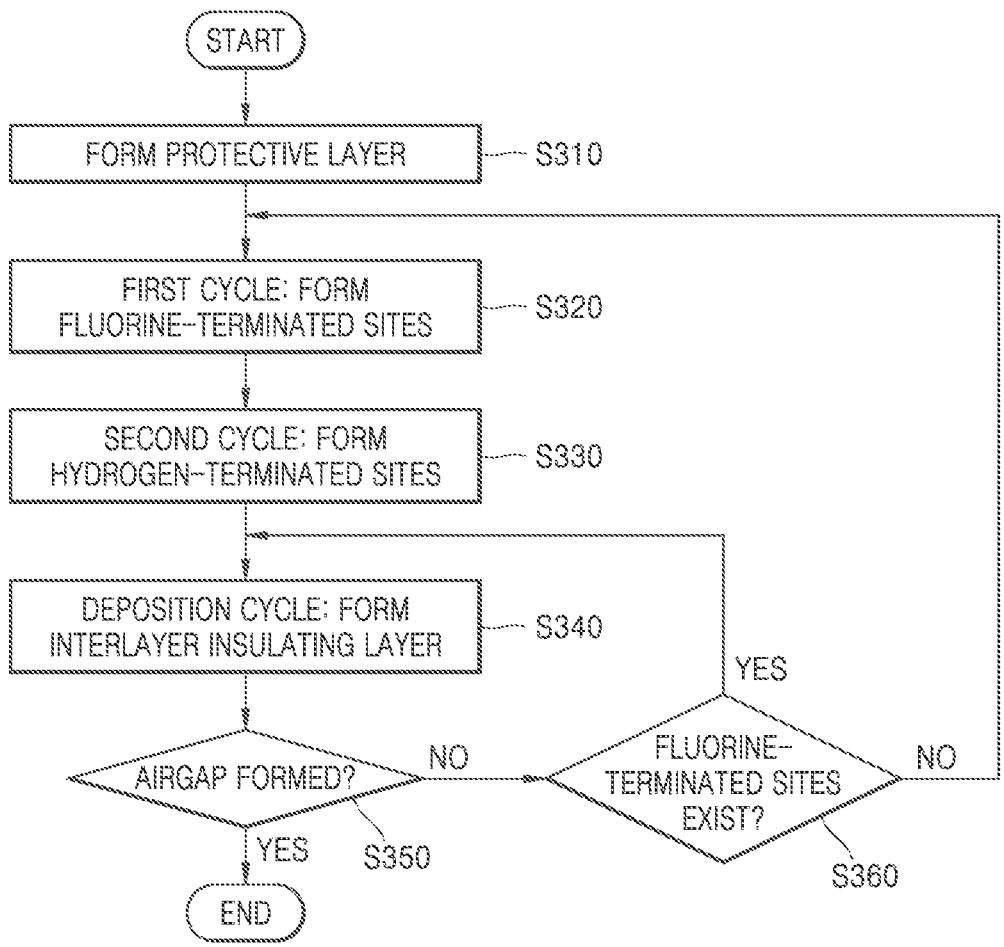
FIG. 3 is a view of a substrate processing method according to embodiments.

FIG. 3 is a view of a substrate processing method according to embodiments. The substrate processing method according to the embodiments may be a variation of the substrate processing method according to the above-described embodiments. Hereinafter, repeated descriptions of the embodiments will not be given herein.

Referring to FIG. 3, first, operation S310 of forming a protective layer on a pattern structure including a first protrusion and a second protrusion is performed, and thereafter, operation S320 of forming fluorine-terminated sites on the protective layer is performed. For example, operation S320 of forming the fluorine-terminated sites by supplying a fluorine-containing gas under a first plasma condition of a first plasma frequency and first process pressure may be performed.

During operation S320 of forming the fluorine-terminated sites, a first cycle may be performed at least once. In this case, the first cycle may include supplying the fluorine-containing gas under a first plasma atmosphere (i.e., the first plasma frequency and the first process pressure) and purging the fluorine-containing gas.

Thereafter, operation S330 of forming hydrogen-terminated sites on the protective layer is performed. For example, the forming of the hydrogen-terminated sites may be performed by supplying a hydrogen-containing gas under a second plasma condition of a second plasma frequency higher than the first plasma frequency and second process pressure higher than the first process pressure.

During operation S330 of forming the fluorine-terminated sites, a second cycle may be performed at least once. In this case, the second cycle may include supplying the hydrogen-containing gas under a second plasma atmosphere and purging the hydrogen-containing gas.

Thereafter, operation S340 of forming an interlayer insulating layer on the protective layer having the fluorine-terminated sites and the hydrogen-terminated sites is performed. During operation S340 of forming the interlayer insulating layer, a deposition cycle may be performed at least once. In this case, the deposition cycle may include supplying a silicon-containing source gas to form Si—H-terminated sites, purging the silicon-containing source gas, supplying a reactive gas having reactivity with the Si—H-terminated sites, and purging the reactive gas.

As described above, the source gas may include a material that is reactive with the hydrogen-terminated sites but not with the fluorine-terminated sites. Thus, the forming of the Si—H-terminated sites may be promoted on the hydrogen-terminated sites and inhibited on the fluorine-terminated sites. As a result, an interlayer insulating layer may be selectively formed on the protective layer.

Thereafter, as the deposition cycle is repeated, operation S350 of determining whether the forming of the interlayer insulating layer is completed is performed. For example, whether the deposition cycle is repeated a certain number of times and/or whether an air gap is formed may be determined. When the forming of the interlayer insulating layer is not completed, the deposition cycle is repeated. However, when a certain criterion is satisfied, operation S320 of forming the fluorine-terminated sites and/or operation S330 of forming the hydrogen-terminating point may be performed before repeating the deposition cycle. For example, when it is determined that there is no or insufficient fluorine-terminated sites, the deposition cycle may be performed after the first cycle and the second cycle are performed.

Figure 4:
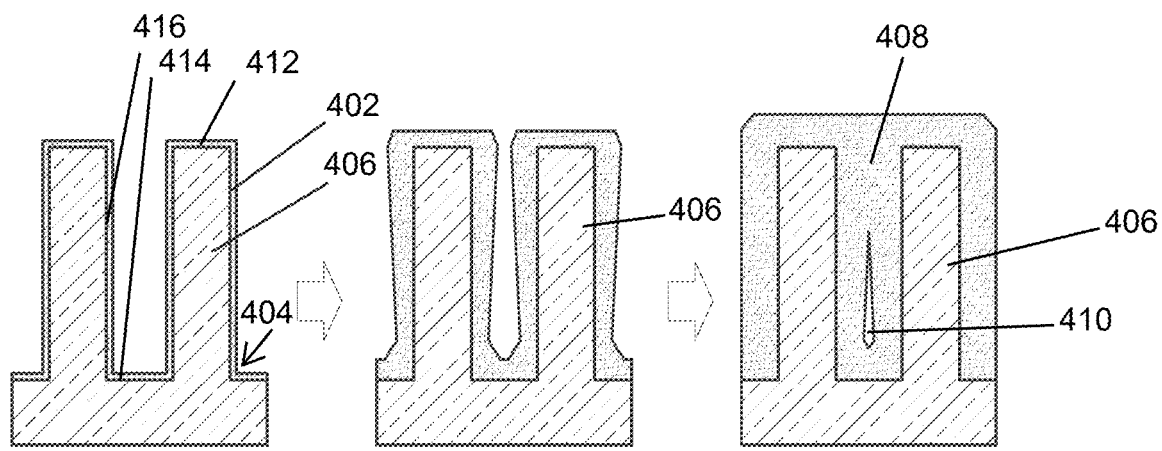
FIG. 4 is a view illustrating a method of forming an air gap while an upper portion of a pattern structure is first closed.

In an air gap manufacturing method using a SiN thin film, a method of forming an air gap while an upper portion of the pattern structure is first closed using an atomic layer deposition method may be considered. However, as the SiN thin film is deposited in a bottom of the pattern structure before the top of the deposition is blocked, a size of the air gap decreases, and thus problems arise as a circuit width of a device decreases. For example, as shown in FIG. 4, when the SiN thin film 402 is deposited in a lower area 404 of the pattern structure 406 and an upper area 408 is closed, a needle-shaped air gap 410 having a narrow width is formed, thereby deteriorating dielectric properties.

Therefore, an object of the disclosure is to propose a method of inhibiting deposition in the lower area of the pattern structure and controlling a size of the air gap.

In the disclosure, with respect to the method of inhibiting deposition in the lower area of the pattern structure and controlling the size of the air gap, it is intended to achieve the object of the disclosure by combining a deposition inhibitor, plasma, and process pressure conditions.

FIG. 5 is a view illustrating a substrate processing method according to embodiments. The substrate processing method according to the embodiments may be a variation of the substrate processing method according to the above-described embodiments. Hereinafter, repeated descriptions of the embodiments will not be given herein.

Referring to FIG. 5, a detailed description of each operation is as follows.

1) STEP 1(a): Forming a protective layer. In this step, a protective layer 2 is formed on a pattern structure 1. For example, a SiN film is uniformly deposited on the pattern structure 1 by plasma enhanced atomic layer deposition (PEALD). This step is to form a protective layer for protecting the pattern structure from fluorine (F) ions and radicals activated in the next step to be described later. The protective layer 2 is formed to a thickness of 30 Å.

2) STEP 2(b): Supplying a deposition inhibitor and forming deposition inhibitor sites. In this step, a deposition inhibitor is supplied on the protective layer 2 formed in the first step. Fluorine is supplied as the deposition inhibitor to form fluorine-terminated sites on the protective layer 2. For example, RF power is used to activate nitrogen trifluoride ($NF_3$) to generate fluorine radicals. This step proceeds under low frequency RF power and low process pressure conditions to allow the fluorine radicals to reach a bottom surface of the pattern structure, so that a mean free path of the fluorine radicals is extended, and the fluorine radicals reach the bottom surface of the pattern structure. The fluorine-terminated sites are also formed on a protective layer on the bottom surface of the pattern structure. In this step, the deposition inhibitor may be supplied at least once in the form of, for example, a pulse.

3) STEP 3(c): Forming film-forming sites. In this step, film-forming sites are formed on a pattern structure on which fluorine-containing deposition inhibitor sites (inhibitor sites or fluorine-terminated sites) are formed. In this step, activated hydrogen radicals are supplied. The hydrogen radicals react with fluorine to convert the fluorine-terminated sites into hydrogen-terminated sites. The hydrogen-terminated sites act as film-forming sites. To be more specific, the hydrogen-terminated sites react with a source element-containing gas in a subsequent step and they are converted into source element containing-terminated sites. In this step, by proceeding under high frequency RF power and high process pressure conditions for forming hydrogen-terminated sites in an upper portion of the pattern structure, a mean free path of the hydrogen radicals is shortened, and hydrogen-terminated sites are formed in an upper area of the pattern structure. In this step, a hydrogen gas may be supplied at least once in a pulse form.

4) STEP 4(d): Supplying a source gas (precursor). In this step, a source gas is supplied. As the source gas, for example, a raw material gas containing silicon, an aminosilane, or an iodosilane gas is supplied. Because the hydrogen-terminated sites, which are bonding sites, are formed on the pattern structure in STEP 3, the source gas reacts with the hydrogen-terminated sites on the pattern structure to form source element containing-terminated sites. For example, when a source gas containing a silicon element is supplied, Si—H-terminated sites may be formed. However, because the fluorine-terminated sites, which are deposition inhibitor sites, are still located in the lower area of the pattern structure, source element containing-terminated sites are not formed.

5) STEP 5(e): Supplying a reactive gas. In this step, a reactive gas that reacts with a source-containing gas is supplied to form a thin film through a chemical reaction with a source element. For example, by supplying a Si source gas in STEP 4 and then supplying a nitrogen reactive gas activated with RF power in STEP 5, a silicon nitride film may be formed by chemically reacting with the source element containing-terminated sites. Alternatively, a silicon oxide film may be formed by supplying an activated oxygen gas. However, because the fluorine-terminated sites, which are deposition inhibitor sites, are still located in the lower area of the pattern structure, source element containing-terminated sites are not formed.

6) STEP 6(f): Forming an air gap. By repeating STEP 4 and STEP 5 (first repeat), an air gap is formed in which an upper portion of a pattern is closed and the inside of the pattern is empty. It can be seen that a width G of the air gap in FIG. 5(f) is greater than a width of an air gap in FIG. 4. This is because, as shown in FIGS. 5(b) to (e), film deposition inhibitor sites are in a lower area of a pattern structure, and thus do not react with a source gas and no film is formed. Accordingly, there is a technical effect of maintaining a maximum width of the air gap by supplying a deposition inhibitor to the pattern structure according to the disclosure.

During a first repetition period (first repeat) of FIG. 5, the source gas and a reactive gas are supplied a plurality of times. However, due to the repeated supply of the source gas and the reactive gas, in particular, repeated and continuous supply of active species, deposition inhibitor sites in the lower area of the pattern structure may be reduced. Therefore, after the first repetition period is performed a certain number of times (first repeat), a deposition inhibitor is again supplied to the pattern structure (second repeat). As shown in FIG. 5, after repeating FIGS. 5(d) to 5(e) a certain number of times, steps of FIGS. 5(b) to 5(e) are repeated (second repeat). Accordingly, there is a technical effect of maintaining constant deposition inhibitor sites in the lower area of the pattern structure until the air gap is formed and preventing a decrease in a width of the air gap.

Figure 6:
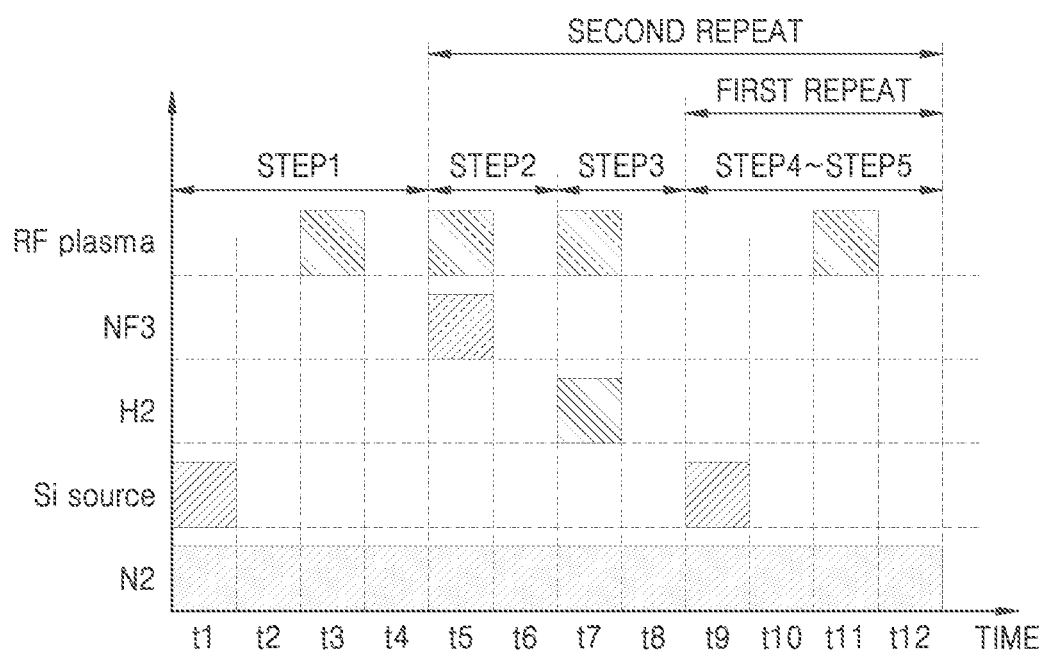
FIG. 6 is a view illustrating a process sequence of an embodiment according to FIG. 5.

FIG. 6 is a view illustrating a process sequence of an embodiment according to FIG. 5. FIG. 6 shows a process of forming an air gap while depositing a SiN thin film on a pattern structure by a PEALD method. Sections t1 to t4 of FIG. 6 correspond to a protective layer deposition of STEP1 (a) of FIG. 5, and sections t5 to t6 correspond to a deposition inhibitor supply and deposition inhibitor site formation of STEP2(b) of FIG. 5. Sections t7 to t8 of FIG. 6 correspond to a hydrogen gas supply and film forming site formation of STEP3(c) of FIG. 5, and sections t9 to t12 correspond to a Si source gas supply of STEP4(d) of FIG. 5 and a nitrogen radical supply of STEP5(e) of FIG. 5. The sections t9 to t12 of FIG. 6 are repeated a plurality of times (first repeat), and thereafter, the sections t5 to t12 are repeated (second repeat), thereby maintaining the deposition inhibitor sites in the lower area of the pattern structure and preventing a decrease in a width of the air gap. In FIG. 6, nitrogen gas ($N_2$) is a reactive purge gas that chemically reacts with a silicon source gas when activated by RF power, and otherwise, is an inert gas and is used as a silicon source carrier gas and a purge gas.

Table 1 below shows RF frequency and process pressure conditions for each step of FIGS. 5 to 6.

TABLE 1

|  | STEP 1 | STEP 2 | STEP 3 | STEP 4 and STEP 5 |
|---|---|---|---|---|
| RF frequency | High (13.56 MHz) | Low (430 kHz) | High (13.56 MHz) | High (13.56 MHz) |
| Process pressure | High (5 Torr to 30 Torr) | Low (1 Torr to 5 Torr) | High (5 Torr to 30 Torr) | High (5 Torr to 30 Torr) |

Figure 7:
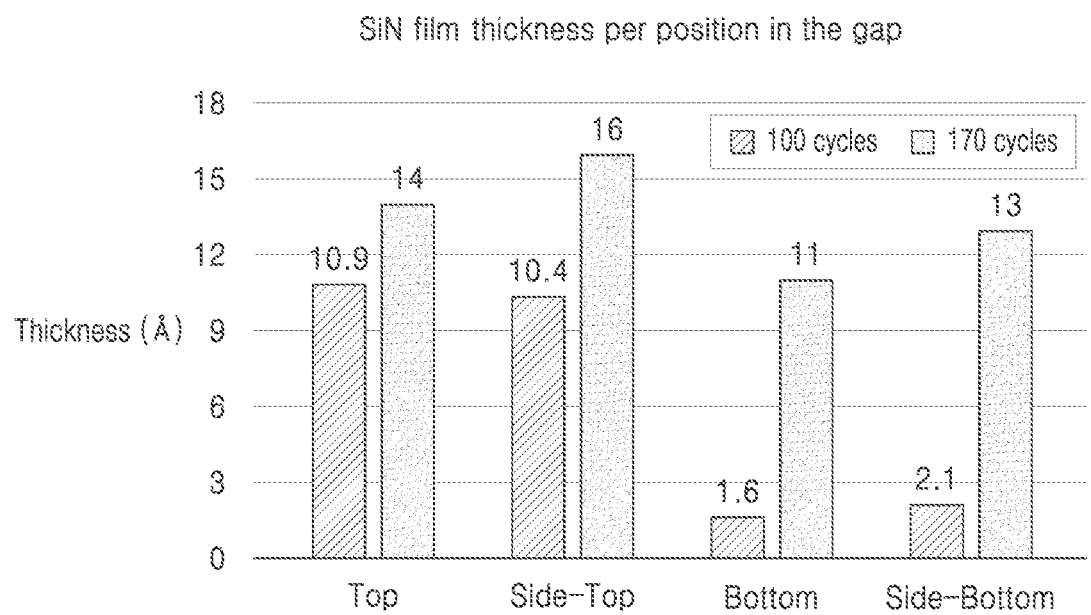
FIG. 7 is a view illustrating a thickness of a SiN film for each location in a pattern structure according to the number of cycles during a first repetition period of FIGS. 5 to 6.

FIG. 7 illustrates a thickness of a SiN film for each location in a pattern structure according to the number of cycles during a first repetition period (first repeat) of FIGS. 5 to 6.

Referring to FIG. 7, until 100 cycles, a deposition thickness of a SiN film formed in a bottom of the pattern structure is 1.6 Å, and a deposition thickness of the SiN film formed in a side-bottom of the pattern structure is 2.1 Å, whereas a deposition thickness of the SiN film formed in a top of the pattern structure is 10.9 Å, and a deposition thickness of the SiN film formed in a side-top of the pattern structure is 10.4 Å, and thus it can be seen that film deposition in a lower area is sufficiently inhibited within an allowable range. However, at 170 cycles, a deposition thickness of the SiN film formed in the bottom of the pattern structure is 11 Å, and a deposition thickness of the SiN film formed in the side-bottom of the pattern structure is 13 Å, whereas a deposition thickness of the SiN film formed in the top of the pattern structure is 14 Å, and a deposition thickness of the SiN film formed in the side-top of the pattern structure is 16 Å, and thus it can be seen that a width of the air gap in the lower area is considerably reduced as in the example of FIG. 4. Therefore, according to the embodiments of FIGS. 5 to 6, it can be seen that a maximum value of a preferred first repetition period is approximately 100 cycles. In other words, it is preferable to perform 100 cycles during the first repetition period (first repeat) and then to perform a second repetition period (second repeat) of supplying a deposition inhibiting gas (inhibitor) again. Therefore, there is a technical effect of continuously maintaining the deposition inhibitor sites in the lower area of the pattern structure.

Table 2 below shows deposition conditions of a SiN thin film according to an embodiment. As a Si source gas, a gas containing Si, such as at least one source gas of aminosilane, iodosilane, dichlorosilane (DCS), and monochlorosilane (MCS) is supplied. The source gas is supplied to a reactor using a nitrogen gas as a carrier gas. The nitrogen gas is a reactive purge gas, and chemically reacts with the source gas when activated by RF power, but otherwise, is used as a source carrier gas or a purge gas. As a reactive gas, a gas containing nitrogen, such as at least one of nitrogen, nitrogen oxide, nitrogen dioxide, and ammonia may be supplied. For RF power, high-frequency power of 13.56 MHz and low-frequency power of 470 kHz are differentially applied in steps.

TABLE 2

|  |  | STEP 1, STEP 4 to STEP 5 | STEP 2 (Inhibitor step) | STEP 3 ($H_2$ flow step) |
|---|---|---|---|---|
| Gas flow rate (sccm) | Si source (Carrier $N_2$) | 1,000-4,000 | — | — |
|  | $N_2$ | 2,000-10,000 | 2,000-10,000 | 2,000-10,000 |
|  | $NF_3$ | — | 100-2,000 | — |
|  | $H_2$ | — | — | 100-1,000 |
| Process time (second) | Source supply | 0.1-1.0 | — | — |
|  | Source purge | 0.1-1.0 | — | — |
|  | Reactant supply (RF plasma) | 0.5-5.0 | — | — |
|  | Reactant purge | 0.1-1.0 | 0.1-1.0 | 0.1-1..0 |
|  | $NF_3$ supply (RF plasma) | — | 0.5-30 | — |
|  | $NF_3$ purge | — | 0.1-1.0 | — |
|  | $H_2$ supply (RF plasma) | — | — | 0.5-5.0 |
|  | $H_2$ purge | — | — | 0.1-1.0 |
| RF power (W) | 13.56 MHz | 100-1,000 W | — | 100-1,000 W |
|  | 430 kHz | — | 100-1,000 W | — |
| Process pressure (Torr) |  | 5 Torr-30 Torr | 1 Torr-5 Torr | 5 Torr-30 Torr |
| Temperature (° C.) |  | 350-550 | 350-550 | 350-550 |

As described above, according to embodiments, in forming an air gap in a pattern structure, an air gap structure may be formed in a lower area of the pattern structure by supplying a deposition inhibitor by controlling an RF frequency and process pressure. In particular, by supplying the deposition inhibitor, a decrease in an air gap width may be minimized and the air gap structure may be maintained. In addition, by applying a first repetition period and a second repetition period, deposition inhibitor sites may be continuously maintained in the lower area of the pattern structure and the air gap structure may be stably maintained.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope of the disclosure as defined by the following claims.

What is claimed is:

1. A substrate processing method comprising:
   forming a protective layer on a pattern structure including an upper surface, a lower surface, and a side surface connecting the upper surface and the lower surface;
   supplying a fluorine-containing gas under a first plasma condition comprising a first frequency and first process pressure to form fluorine-terminated sites on the protective layer;
   purging the fluorine-containing gas;
   supplying a hydrogen-containing gas under a second plasma condition comprising a second frequency higher than the first frequency and second process pressure higher than the first process pressure to form hydrogen-terminated sites on the protective layer;
   purging the hydrogen-containing gas;
   supplying a silicon-containing source gas to form Si—H-terminated sites, wherein the forming of the Si—H-terminated sites is promoted on the hydrogen-terminated sites and inhibited on the fluorine-terminated sites;
   purging the silicon-containing source gas;
   forming an interlayer insulating layer on the protective layer by supplying a reactive gas having reactivity with the Si—H-terminated sites; and
   purging the reactive gas.

2. The substrate processing method of claim 1, wherein the fluorine-terminated sites are at a first portion of the protective layer in a lower portion of the pattern structure, and
   the hydrogen-terminated sites are at a second portion of the protective layer in an upper portion of the pattern structure.

3. The substrate processing method of claim 2, wherein the forming the interlayer insulating layer is inhibited on the first portion.

4. The substrate processing method of claim 1, wherein the forming of the interlayer insulating layer further comprises
   supplying a reactive gas.

5. The substrate processing method of claim 1, further comprising forming a second layer on the interlayer insulating layer.

6. The substrate processing method of claim 5, wherein the second layer comprises silicon nitride.

7. The substrate processing method of claim 5, wherein the second layer comprises silicon oxide.

8. The substrate processing method of claim 1, wherein the step of supplying a fluorine-containing gas is performed at least once.

9. The substrate processing method of claim 1, wherein the fluorine-containing gas includes $NF_3$.

10. The substrate processing method of claim 1, wherein, the step of supplying a hydrogen-containing gas is performed at least once.

11. The substrate processing method of claim 1, wherein the hydrogen-containing gas includes $H_2$.

12. The substrate processing method of claim 1, comprising forming
    an air gap.

13. The substrate processing method of claim 12, wherein the air gap includes a gas containing a fluorine element.

14. The substrate processing method of claim 1, wherein the step of forming the interlayer insulating layer comprises a cyclical process.

15. The substrate processing method of claim 14, wherein a cycle of the cyclical process is repeated a number of times.

16. The substrate processing method of claim 1, wherein the interlayer insulating layer comprises silicon nitride.

17. The substrate processing method of claim 1, wherein the interlayer insulating layer comprises silicon oxide.

* * * * *